(12) United States Patent
Im

(10) Patent No.: US 8,803,558 B2
(45) Date of Patent: Aug. 12, 2014

(54) INTEGRATED CIRCUIT

(71) Applicant: SK hynix Inc., Icheon (KR)

(72) Inventor: Jae-Hyuk Im, Icheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/842,723

(22) Filed: Mar. 15, 2013

(65) Prior Publication Data

US 2014/0062534 A1   Mar. 6, 2014

(30) Foreign Application Priority Data

Aug. 28, 2012   (KR) .................. 10-2012-0094378

(51) Int. Cl.
*H03K 5/22* (2006.01)
*H03K 5/153* (2006.01)

(52) U.S. Cl.
USPC ................................ 327/74; 327/99; 327/538

(58) Field of Classification Search
CPC ........................................................ G05F 1/465
USPC .............................................. 327/74, 99, 538
See application file for complete search history.

(56) References Cited

U.S. PATENT DOCUMENTS

| 7,319,361 | B2 * | 1/2008 | Jin ................................ 327/543 |
| 7,612,587 | B2 * | 11/2009 | Cheng ............................ 327/99 |
| 8,384,446 | B2 * | 2/2013 | Cho .............................. 327/143 |

FOREIGN PATENT DOCUMENTS

| KR | 10-2002-0006303 A | 1/2002 |
| KR | 10-2008-0024413 A | 3/2008 |

* cited by examiner

*Primary Examiner* — John Poos

(57) ABSTRACT

An integrated circuit includes a plurality of semiconductor devices. Each of the semiconductor devices includes an internal voltage generation unit configured to generate a plurality of internal voltages, a voltage select output unit configured to output a default voltage of a plurality of internal voltages to a preset pad in response to an initial value of a select code, and selectively output the other voltages of the plurality of internal voltages to the pad in response to variations of the select code, and a stack operation control unit configured to control the voltage select output unit to output the default voltage to the pad in response to a stack signal and a predetermined value of the select code, instead of the initial value of the select code, and whether or not to activate the stack signal is determined according to whether or not the plurality of semiconductor devices are stacked.

8 Claims, 4 Drawing Sheets

INTEGRATED CIRCUIT

CROSS-REFERENCE TO RELATED APPLICATIONS

The present application claims priority of Korean Patent Application No. 10-2012-0094378, filed on Aug. 28, 2012, which is incorporated herein by reference in its entirety.

BACKGROUND

1. Field

Exemplary embodiments of the present invention relate to semiconductor design technology, and more particularly, to an integrated circuit including a plurality of semiconductor devices which are stacked in a package.

2. Description of the Related Art

In order for a semiconductor device to operate, the semiconductor device generates internal voltages suitable for internal use, using various external voltages. Since the internal voltage is generated using a voltage applied from an external source, it is necessary to monitor whether the generated internal voltage is normal or not.

FIG. 1 illustrates a conventional method for monitoring an internal voltage using a preset pad PAD. FIG. 1 illustrates a case in which a reference voltage VREF is outputted to the pad PAD.

Although "VREF" represents a reference voltage and "VINT" represents an internal voltage used to perform operations in the semiconductor device, both of the voltages are measured in essentially the same fashion.

The monitoring method of FIG. 1 connects a particular internal voltage or reference voltage to the pad PAD and then measures the internal voltage or reference voltage. In this monitoring method, separate control is not required, and the internal voltage or reference voltage is read as it is.

FIG. 2 illustrates a conventional monitoring method using a multi-measuring device. In this method, a controller is provided to select one of a plurality of internal voltages VINT1 to VINT3 and reference voltages VREF1 to VREF3, and a selector is provided to connect the internal voltage or reference voltage selected by the controller to a preset pad PAD.

FIG. 3 illustrates configurations of the controller and the selector which are components of the multi-measuring device of FIG. 2. The controller includes a decoder configured to select a voltage which is to be monitored. The voltage may be one of the internal voltages VINT1 to VINT3 and reference voltages VREF1 to VREF3. For example, when a three-bit select code MON<0:2> is inputted, the controller may selectively monitor up to eight internal voltages.

In this method, when all bits of the select code MON<0:2> are inputted at a low level as an initial value, a default voltage which is one of the plurality of internal voltages VREF1 to VREF3 and VINT1 to VINT3 is connected to the pad PAD. In devices according to FIG. 3, the default voltage is typically the first reference voltage VREF1, but may be changed by a designer. Therefore, during a test operation such as a probe test, the default voltage VREF1 may be connected to the pad PAD to perform a forcing test. That is, in a default state where none of the bits of the select code MON<0:2> are activated to a high level, the default voltage VREF1 for measuring and forcing is connected to the pad PAD.

In a conventional monitoring method, when only one semiconductor device is packaged in an integrated circuit, no problems occur. Instead, since the default voltage VREF1 is connected by default, the forcing test may be implemented easily and quickly. However, when two or more semiconductor devices are packaged in a single integrated circuit, the situation may change.

FIG. 4 illustrates a problem which occurs when a conventional internal voltage multi-measuring device is used to measure internal voltages VREF1 to VREF3 and VINT1 to VINT3 of two or more semiconductor devices stacked in an integrated circuit.

When the internal voltages VREF1 to VREF3 and VINT1 to VINT3 of two or more semiconductor devices in a single package are to be monitored, only the semiconductor device stacked at the lowermost part of the package is directly connected to balls or pins of the packaged integrated circuit. Therefore, input/output pads of the respective semiconductor devices must be connected through a TSV (through silicon via). However, since default voltages are outputted to preset pads of the respective semiconductor devices, the default voltages outputted through the pads may be shorted among the stacked semiconductor devices at the same time when the pads are connected to the same TSV. Furthermore, as described with reference to FIG. 3, the default voltages outputted from the respective semiconductor devices may differ from each other.

For reference, in order to prevent the default voltages from being shorted among the plurality of semiconductor devices having a stack structure as illustrated in FIG. 4, the semiconductor devices may be controlled not to output the default voltages to the pads. In this case, the select code MON<0:2> must be inputted from an external source whenever a semiconductor device is tested, thereby reducing the test efficiency. When several hundred or thousand semiconductor devices must be tested, it may take quite a long time to perform the forcing test using select codes input from an external source.

SUMMARY

An embodiment of the present invention is directed to an integrated circuit capable of performing a forcing test of stably outputting internal voltages of a plurality of semiconductor devices included therein, even when the plurality of semiconductor devices share an input/output pad.

In accordance with an embodiment of the present invention, an integrated circuit includes a plurality of semiconductor devices, wherein each of the semiconductor devices includes: an internal voltage generation unit configured to generate a plurality of internal voltages; a voltage select output unit configured to output a default voltage of the plurality of internal voltages to a preset pad in response to an initial value of a select code, and selectively output the other voltages of the plurality of internal voltages to the pad in response to variations of the select code; and a stack operation control unit configured to control the voltage select output unit to output the default voltage to the pad in response to a stack signal and a preset value of the select code, instead of the initial value of the select code, and whether or not to activate the stack signal is decided according to whether the plurality of semiconductor devices are stacked or not.

DETAILED DESCRIPTION

Figure 1:
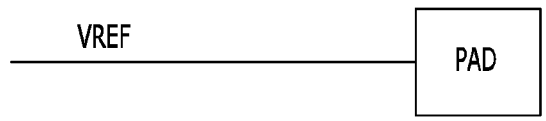
FIG. 1 illustrates a conventional method for monitoring an internal voltage of a semiconductor device.
Figure 2:
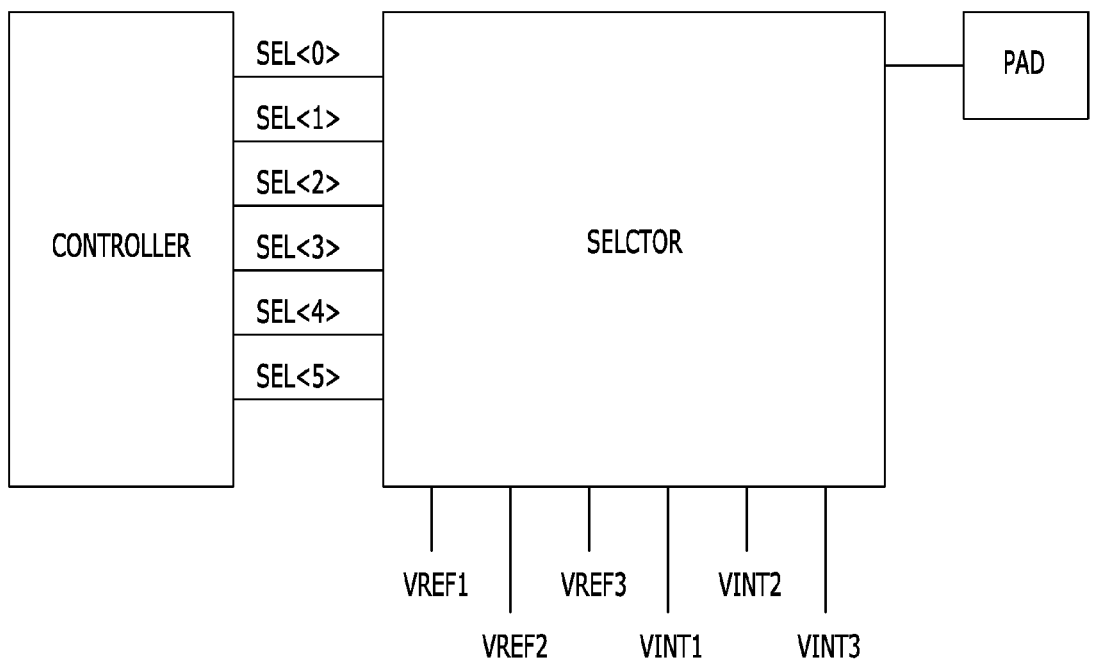
FIG. 2 illustrates the configuration of a conventional multi-measuring device for measuring a plurality of internal voltage generated by a semiconductor device.
Figure 3:
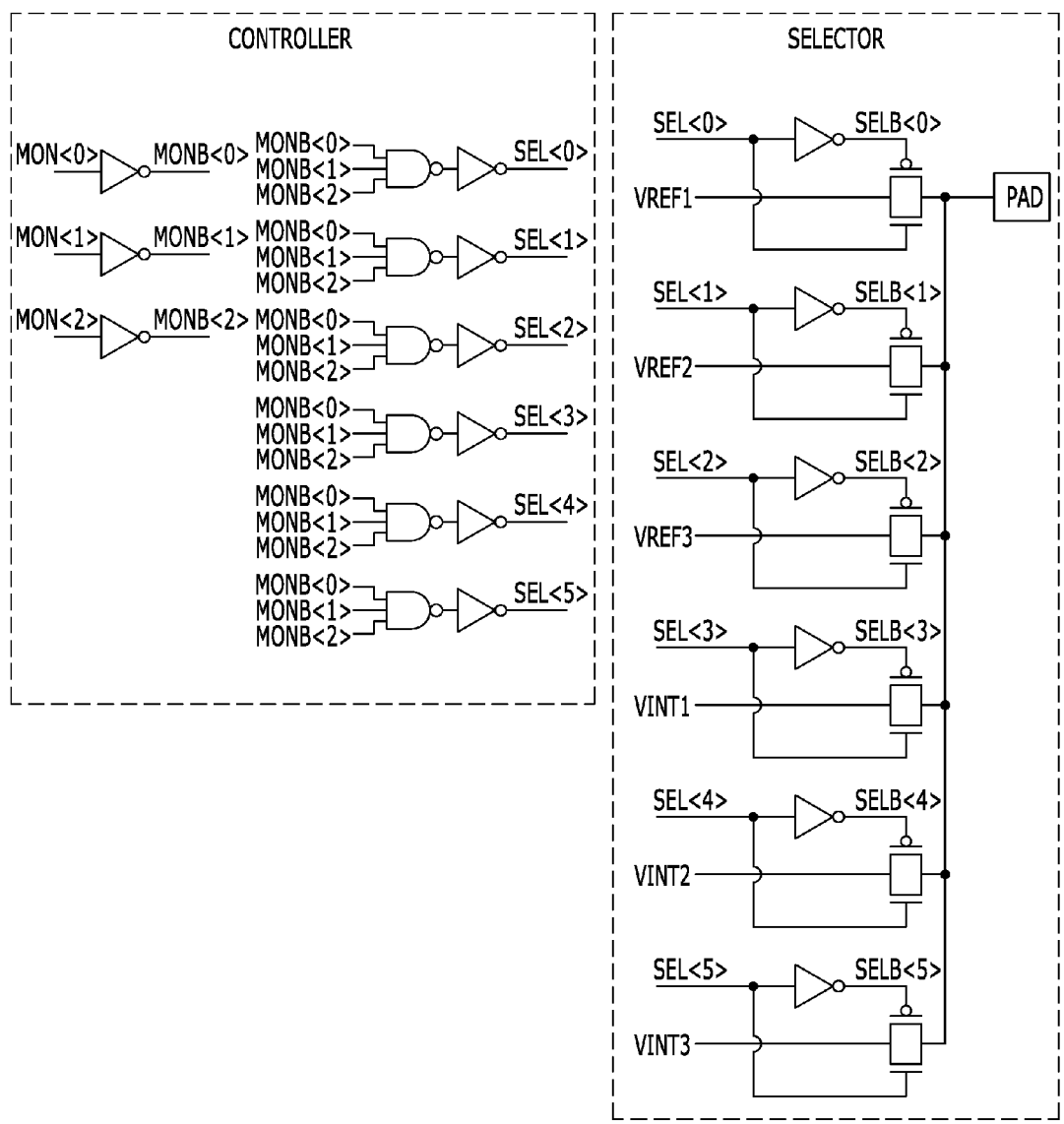
FIG. 3 illustrates detailed configurations of a controller and a selector illustrated in FIG. 2.
Figure 4:
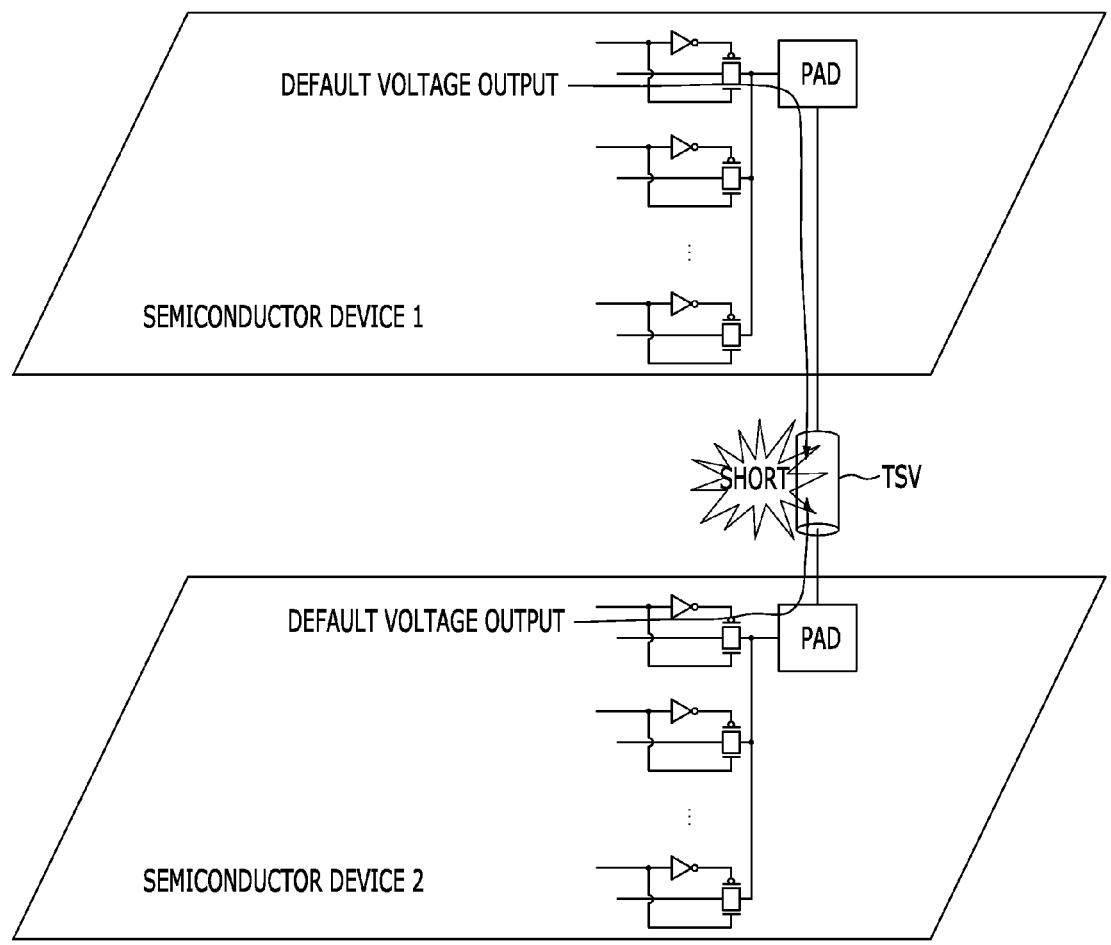
FIG. 4 illustrates a problem which occurs when a plurality of semiconductor devices illustrated in FIG. 2 have a stack structure.

Exemplary embodiments of the present invention will be described below in more detail with reference to the accompanying drawings. The present invention may, however, be embodied in different forms and should not be construed as limited to the embodiments set forth herein. Rather, exemplary embodiments are provided so that this disclosure will be thorough and complete, and will convey the scope of the present invention to those skilled in the art. Throughout the disclosure, like reference numerals refer to like parts throughout the various figures and embodiments of the present invention.

Figure 5:
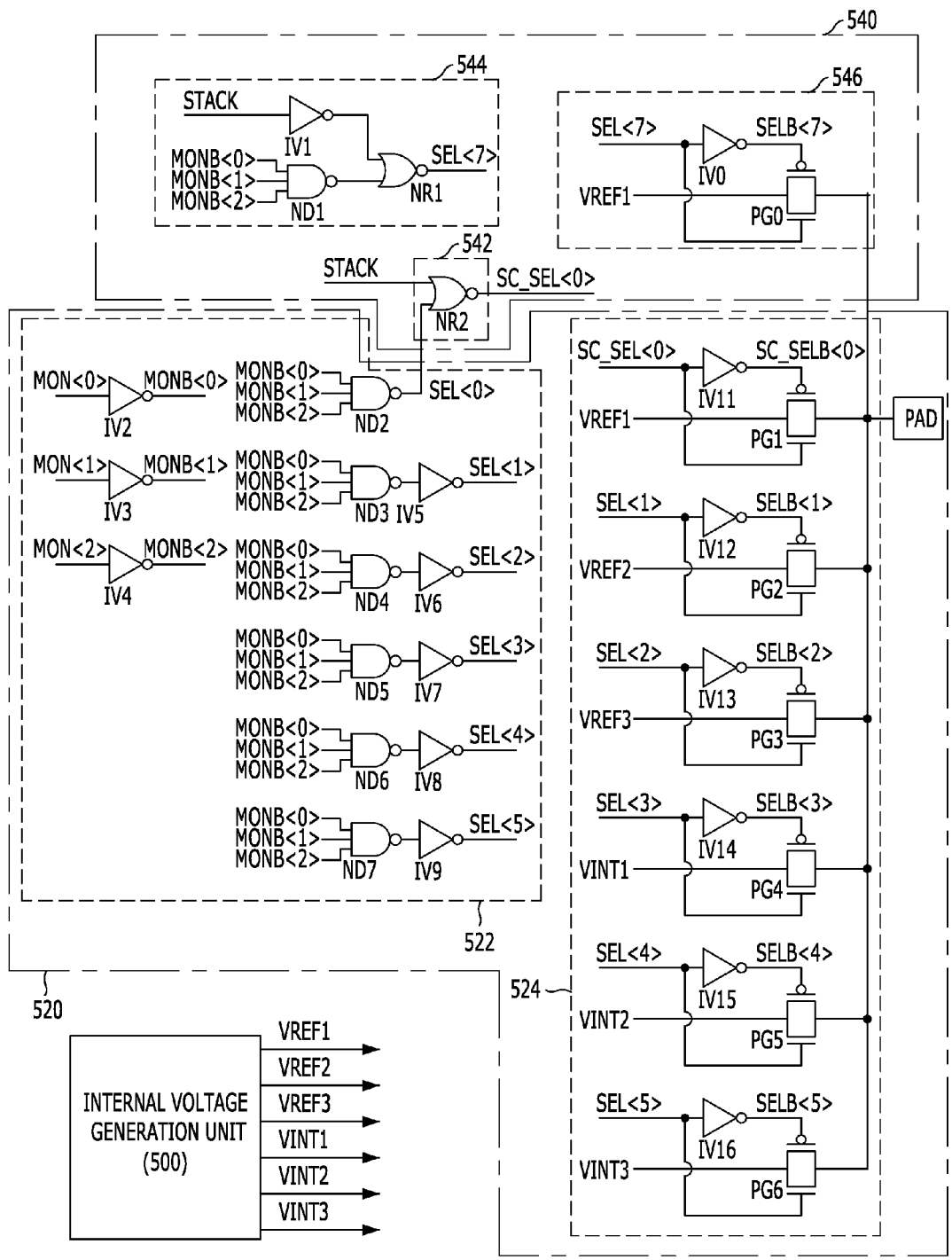
FIG. 5 illustrates the configuration of a multi-measuring device for measuring a plurality of internal voltages in accordance with an embodiment of the present invention.

FIG. 5 illustrates the configuration of a device for measuring a plurality of internal voltages generated in a semiconductor device in accordance with an embodiment of the present invention.

Referring to FIG. 5, a semiconductor device in accordance with an embodiment of the present invention includes an internal voltage generation unit 500, a voltage select output unit 520, and a stack operation control unit 540. The internal voltage generation unit 500 is configured to generate a plurality of internal voltages VREF1, VREF2, VREF3, VINT1, VINT2, and VINT3. The voltage select output unit 520 is configured to output a default voltage VREF1 to a preset pad PAD when all bits of a select code MON<0:2> are at a low level, and selectively output the other voltages VREF2, VREF3, VINT1, VINT2, and VINT3 to the pad PAD in response to variations of the select code MON<0:2>. The stack operation control unit 540 is configured to control the voltage select output unit 520 to output a default voltage to the pad PAD based on a stack signal STACK and a preset value of the select code MON<0:2>.

As shown in FIG. 5, the voltage select output unit 520 includes a decoding section 522 and a transmission control section 524. The decoding section 522 is configured to generate a plurality of select signals SEL<0:5>, each of which corresponds to one of the plurality of internal voltages VREF1, VREF2, VREF3, VINT1, VINT2, and VINT3, based on the stack signal STACK and results obtained by decoding the select code MON<0:2>. The transmission control section 524 is configured to control whether or not to transmit the default internal voltage VREF1 to the PAD based on a default select signal SC_SEL<0>, which is outputted from the stack operation control unit 540 in response to the initial select signal SEL<0>, and to control whether or not to transmit internal voltages VREF2, VREF3, VINT1, VINT2, and VINT3 to the pad PAD based on signals SEL<1:5>, respectively. The initial select signal SEL<0> corresponds to the value of the select code MON<0:2> of which all bits are at a low level.

The decoding section 522 includes a plurality of NAND gates ND2 to ND7 and a plurality of inverters IV2 to IV9. The NAND gate ND2 is configured to generate a high-level initial select signal SEL<0> when all bits of an initial value of the select code MON<0:2> are at a low level. The NAND gate ND3 and the inverter IV5 are configured to generate a high-level first select signal SEL<1> when the first bit MON<0> of the select code MON<0:2> is at a high level and the second and third bits MON<1> and MON<2> are at a low level. The NAND gate ND4 and the inverter IV6 are configured to generate a high-level second select signal SEL<2> when the second bit MON<1> of the select code MON<0:2> is at a high level and the first and third bits MON<0> and MON<2> are at a low level. The NAND gate ND5 and the inverter IV7 are configured to generate a high-level third select signal SEL<3> when the first and second bits MON<0> and MON<1> of the select code MON<0:2> are at a high level and the third bit MON<2> is at a low level. The NAND gate ND6 and the inverter IV8 configured to generate a high-level fourth select signal SEL<4> when the first and second bits MON<0> and MON<1> of the select code MON<0:2> are at a low level and the third bit MON<2> is at a high level. The NAND gate ND7 and the inverter IV9 configured to generate a high-level fifth select signal SEL<5> when the first and third bits MON<0> and MON<2> of the select code MON<0:2> are at a high level and the second bit MON<1> is at a low level. The inverters IV2 to IV4 are configured to invert the respective bits of the select code MON<0:2>.

The transmission control section 524 includes a plurality of pass gates PG1 to PG6 and a plurality of inverters IV11 to IV16. The pass gate PG1 and the inverter IV11 are configured to control whether or not to transmit the default voltage VREF1 to the pad PAD based on the default select signal SC_SEL<0> outputted from the stack operation control unit 540. The pass gate PG2 and the inverter IV12 are configured to control whether or not to transmit the second internal voltage VREF2 to the pad PAD based on the first select signal SEL<1>. The pass gate PG3 and the inverter IV13 are configured to control whether or not to transmit the third internal voltage VREF3 to the pad PAD based on the second select signal SEL<2>. The pass gate PG4 and the inverter IV14 are configured to control whether or not to transmit the fourth internal voltage VINT1 to the pad PAD based on the third select signal SEL<3>. The pass gate PG5 and the inverter IV15 are configured to control whether or not to transmit the fifth internal voltage VINT2 to the pad PAD based on the fourth select signal SEL<4>. The pass gate PG6 and the inverter IV16 are configured to control whether or not to transmit the sixth internal voltage VINT3 to the pad PAD based on the fifth select signal SEL<5>.

The stack operation control unit 540 includes a first control section 542, a second control section 544, and an additional transmission control section 546. The first control section 542 is configured to generate the default select signal SC_SEL<0> based on the stack signal STACK and the initial select signal SEL<0>. The second control section 544 is configured to generate an additional select signal SEL<7> when all bits of the select code MON<0:2> are at a high level. The additional transmission control section 546 is configured to control whether or not to transmit the default voltage VREF1 to the pad PAD based on an inverted additional select signal SELB<7>.

In an embodiment, when a plurality of circuits are stacked and coupled to one another through TSVs, a lowest circuit in the stack, which may be referred to as a master circuit, may perform control functions that are not performed by other layers of the stack. Control functions performed by a master layer may include functions performed by control unit 540. Thus, in an embodiment, control unit 540 is only present on the lower circuit layer of a stack, or in a layer that is used to control the stack when the lowest layer circuit is not the control layer. In other embodiments, each layer of the stack may include a control unit 540. In an embodiment, each layer in the stack comprises a voltage select output unit 520, which may be used to test each circuit layer before it is packaged in a stack.

The first control section 542 includes a NOR gate NR2 configured to receive the stack signal STACK and the initial select signal SEL<0>, perform a NOR operation on the received signals, and output the operation result as the default select signal SC_SEL<0>.

Although FIG. 5 shows a stack operation control unit 540 with one first control section 542 configured to receive signal SEL<0>, in an embodiment, control section 542 may comprise a plurality of control circuits, each of which is configured to receive a select signal corresponding to a voltage that is tested after a plurality of circuit layers have been packaged in a stack. Thus, when voltage VREF2 is to be tested after packaging, an embodiment may include a control circuit 542 that is configured to accept select signal SEL<1> corresponding to voltage VREF2.

The second control section 544 includes an inverter IV1, a NAND gate ND1, and a NOR gate NR1. The inverter IV1 is configured to invert the phase of the stack signal STACK. The NAND gate ND1 is configured to generate a low-level output signal only when all bits of the select code MON<0:2> are at a high level. The NOR gate NR1 is configured to receive signals output from the inverter IV1 and the NAND gate ND1, perform a NOR operation on the received signals, and output the operation result as the additional select signal SEL<7>. Thus, a STACK signal may cause a decoding section 522 to not send a particular voltage select signal, while causing a second control section 544 to send a voltage select signal. An embodiment may include a second control section 544 and a transmission control section 546 for each voltage to be tested. Layers may further include first control sections 542 in each layer for each voltage to be tested. In an embodiment, the only voltage to be tested may be a default voltage, while other embodiments may test a plurality of voltages.

The additional transmission control section 546 includes a pass gate PG0 and an inverter IV0 which are configured to control whether or not to transmit the default voltage VREF1 to the pad PAD based on the additional select signal SEL<7>.

The first and second control sections 542 and 544 of the stack operation control unit 540 perform opposing operations in response to the stack signal STACK.

When the stack signal STACK is activated to a high level, the first control section 542 is configured to output the default select signal SC_SEL<0> at a low level, regardless of whether the initial select signal SEL<0> is at a high level or a low level. Therefore, the voltage select output unit 520 does not transmit the default voltage VREF1 to the pad PAD. Instead, the second control section 544 activates the additional select signal SEL<7> when all bits of the select code MON<0:2> are at a high level, and the additional transmission control section 546 outputs the default voltage VREF1 to the pad PAD in response to the activated additional select signal SEL<7>. In summary, when the stack signal STACK is activated to a high level, the default voltage VREF1 is not outputted to the pad PAD when all bits of the select code MON<0:2> are at a low level, which is an initial condition of the select code MON<0:2>. Instead, the voltage VREF1 is outputted to the pad PAD when all bits of the select code MON<0:2> are at a high level.

On the other hand, when the stack signal STACK is at a low level, the second control section 544 deactivates the additional select signal SEL<7> to a low level. That is, even when the select code MON<0:2> has the preset value of which all bits are at a high level, the additional select signal SEL<7> is not activated to a high level when STACK is at a low level. Instead, the first control section 542 activates the default select signal SC_SEL<0> to a high level in response to the initial value of the select code MON<0:2> of which all bits are at a low level, and the voltage select output unit 520 outputs the default voltage VREF1 to the pad PAD in response to the activated default select signal SC_SEL<0>. In summary, when the stack signal STACK is deactivated to a low level, the default voltage VREF1 is not outputted to the pad PAD when the value all bits of the select code MON<0:2> are at a high level. Instead, voltage VREF1 is outputted to the pad PAD when all bits of the select code MON<0:2>, which may be an initial condition of an exemplary device.

A plurality of semiconductor devices of FIG. 5 in accordance with embodiments of the present invention may be stacked in the same package, thereby forming an integrated circuit with a shared input/output pad. Alternatively, semiconductor devices in accordance with embodiments of the present invention may be used in a configuration where they are packaged in an integrated circuit having independent input/output pads.

Whether or not to activate the stack signal STACK may be decided depending on whether the integrated circuit has a stack structure or not. That is, when an integrated circuit has a stack structure in which a plurality of layers including circuits of FIG. 5 are stacked, the signal STACK is activated to a high level, and when the integrated circuit does not have a stack structure, the signal STACK is deactivated to a low level.

Specifically, the signal STACK may be deactivated to a low level when the plurality of semiconductor devices are not stacked, so that the stack operation control unit 540 has no effect on the operation of the voltage select output unit 520. Therefore, the voltage select output unit 520 outputs the default voltage VREF1 to the pad PAD in an initial state where all bits of the select code MON<0:2> are at a low level, and selectively outputs the other voltage VREF2, VREF3, VINT1, VINT2, and VINT3 to the pad PAD in response to variations of the select code MON<0:2>.

On the other hand, the stack signal STACK may be activated when a plurality of semiconductor devices are stacked to form a stack structure sharing an input/output pad. In such an embodiment, the stack operation control unit 540 controls the voltage select output unit 520 to output the default voltage VREF1 to the pad PAD when all bits of the select code MON<0:2> are set at a high level, instead of the initial value of the select code MON<0:2>. Thus, when STACK is activated, the voltage select output unit 520 outputs the default voltage VREF1 to the pad PAD in response to the preset value of the select code MON<0:2> of which all bits are at a high level, and selectively outputs the other voltages VREF2, VREF3, VINT1, VINT2, and VINT3 to the pad PAD in response to variations of the select code MON<0:2>.

In above description of the semiconductor device of FIG. 5 in accordance with an embodiment of the present invention, the initial value of the select code MON<0:2> has been described as having all bits of the select code MON<0:2> at a low level, and the preset value of the select code MON<0:2> which is used to send VREF1 to PAD when STACK is not activated has been explained as all bits being at a high level. However, the particular values used to explain the initial value and the preset value of the select code MON<0:2> are merely examples, and the scope of the present invention is not limited thereto. In various embodiments, the values of the select code MON<0:2> may be changed by a designer's selection. However, each select code in a given embodiment should only be associated with one function, and a different code may be used to transmit a default voltage for each of the stacked and not-stacked conditions.

Furthermore, in the above description, the select code MON<0:2> includes three bits. However, the embodiment is only an example, and in other embodiments the select code may include a larger or smaller number of bits according to a designer's selection. Furthermore, the number of selectable internal voltages may differ between embodiments, as well as the particular codes used to deliver particular voltages.

Although not illustrated in FIG. 5, values and sequences of select codes may be stored in a register included in the semiconductor device. In an embodiment, when a test signal (not illustrated) is not applied, the select code may be fixed at an initial value, and when the test signal is applied, the select code varies according to a sequence set by the test signal.

When the variations and variation sequence of a select code are predetermined, it an auxiliary test operation of sequentially outputting the plurality of internal voltages VREF1, VREF2, VREF3, VINT1, VINT2, and VINT3 may be performed separately from a main test operation of outputting any one of the internal voltages. Therefore, when a test signal is not applied, the semiconductor device does not enter the auxiliary test operation mode, and the select code is fixed to the initial value such that the voltage select output unit 520 automatically outputs the default voltage VREF1. On the other hand, when a test signal is applied to enter the auxiliary test operation mode, the select code may be automatically varied so that the voltage select output unit 520 outputs the plurality of internal voltages VREF1, VREF2, VREF3, VINT1, VINT2, and VINT3 according to a predetermined sequence. Alternatively, in an embodiment, when test signal is applied a second time after the test signal has already been applied to enter the auxiliary test operation period, the select code may be manually varied so that the voltage select output unit 520 outputs any of internal voltages VREF1, VREF2, VREF3, VINT1, VINT2, and VINT3 according to a set sequence.

Meanwhile, in an embodiment, the sequence and timing of delivering internal voltages during a test sequence may be determined by an algorithm that is internal or external to a device. Therefore, the select code MON<0:2> may be substituted with a test code (not illustrated) applied from a source external to the semiconductor device. That is, select code values may be directly applied from outside the semiconductor device and varied to be used in a main test mode, which is separate from an auxiliary test mode in which the values and sequence of the select code are predetermined.

In accordance with an embodiment of the present invention, when a plurality of semiconductor devices included in an integrated circuit are stacked to have a stack structure sharing an input/output pad, default voltages outputted from the respective semiconductor devices are controlled according to select codes. Therefore, a forcing test of outputting internal voltages of the respective devices may be stably performed without a short circuit. Furthermore, when a plurality of semiconductor devices included in an integrated circuit are not stacked or otherwise have independent input/output pads, default voltages outputted from the respective semiconductor devices may be set regardless of whether a select code is inputted or not. Therefore, a forcing test of outputting internal voltages of the respective semiconductor devices may be quickly performed.

Accordingly, the forcing test of outputting the internal voltages of the respective semiconductor devices may be efficiently performed regardless of whether the semiconductor devices included in the integrated circuit have a stack structure or not.

While the present invention has been described with respect to the specific embodiments, it will be apparent to those skilled in the art that various changes and modifications may be made without departing from the spirit and scope of the invention as defined in the following claims.

For example, the positions and types of the logic gates and transistors in the above-described embodiment of the present invention may be differently set depending on the polarities of inputted signals.

What is claimed is:

1. An integrated circuit comprising a plurality of semiconductor devices,
   wherein each of the semiconductor devices comprises:
   an internal voltage generation unit configured to generate a plurality of internal voltages;
   a voltage select output unit configured to output a default voltage of the plurality of internal voltages to a pad based on an initial value of a select code; and
   a stack operation control unit configured to control the voltage select output unit to output the default voltage to the pad in response to a stack signal and a predetermined value of the select code, instead of an initial value of the select code,
   wherein a level of the stack signal is in a first state when the plurality of semiconductor devices are arranged in a stacked configuration, and the level of the stack signal is in a second state when the plurality of semiconductor devices are not arranged in a stacked configuration.

2. The integrated circuit of claim 1, wherein the voltage select output unit selectively outputs the other voltages of the plurality of internal voltages to the pad based on variations of the select code.

3. The integrated circuit of claim 1, wherein the stack signal is deactivated when the plurality of semiconductor devices are not stacked so that the stack operation control unit has no effect on the operation of the voltage select output unit, and
   the voltage select output unit is configured to output the default voltage to the pad based on the initial value of the select code, and to selectively output the other voltages of the plurality of internal voltages to the pad in response to variations of the select code.

4. The integrated circuit of claim 3, wherein the stack signal is activated when the plurality of semiconductor devices are stacked to share an input/output pad,
   the stack operation control unit is configured to control the voltage select output unit to output the default voltage to the pad based on a predetermined value of the select code that is not the initial value of the select code, and
   the voltage select output unit is configured to output the default voltage to the pad based on the predetermined value of the select code, and to selectively output the other voltages of the plurality of internal voltages to the pad based on the variations of the select code.

5. The integrated circuit of claim 4, wherein the variations and a variation sequence of a plurality of select codes are stored in a register included in the semiconductor device,
   when a test signal is not applied, the select code has the initial value, and
   when the test signal is applied, the select code is sequentially varied according to the variation sequence.

6. The integrated circuit of claim 4, wherein the select code is substituted with a test code applied from a source external to the semiconductor device.

7. The integrated circuit of claim 1, wherein the voltage select output unit comprises:
- a decoding section configured to generate a plurality of select signals, each of which corresponds to one of the plurality of internal voltages, based on the stack signal and results obtained by decoding the select code; and
- a transmission control section configured to control transmission of the plurality of internal voltages to the pad based on the variations of the select code and a default select signal,
- wherein the stack operation control unit is configured to provide the default select signal to the transmission control section.

8. The integrated circuit of claim 7, wherein the stack operation control unit comprises:
- a first control section configured to generate the default select signal based on the stack signal and the initial select signal;
- a second control section configured to generate an additional select signal based on the predetermined value of the select code; and
- an additional transmission control section configured to control transmission of the default voltage to the pad based on the additional select signal.

* * * * *